(12) United States Patent
Van Gastel

(10) Patent No.: US 8,001,676 B2
(45) Date of Patent: Aug. 23, 2011

(54) COMPONENT PLACEMENT APPARATUS

(75) Inventor: Josephus Martinus Maria Van Gastel, Tilburg (NL)

(73) Assignee: Assembleon N.V., Veldhoven (NL)

( * ) Notice: Subject to any disclaimer, the term of this patent is extended or adjusted under 35 U.S.C. 154(b) by 175 days.

(21) Appl. No.: 11/572,893

(22) PCT Filed: Jun. 9, 2005

(86) PCT No.: PCT/NL2005/000416
§ 371 (c)(1),
(2), (4) Date: Jul. 17, 2007

(87) PCT Pub. No.: WO2006/011783
PCT Pub. Date: Feb. 2, 2006

(65) Prior Publication Data
US 2008/0000077 A1    Jan. 3, 2008

(30) Foreign Application Priority Data
Jul. 30, 2004 (EP) .................................... 04103672

(51) Int. Cl.
*B23P 19/00* (2006.01)
(52) U.S. Cl. ................ 29/729; 29/739; 29/740; 29/741; 29/759; 29/760
(58) Field of Classification Search .................... 29/739, 29/740, 831, 832, 743, 729, 759, 760, 742; 414/222, 277, 273, 280, 412
See application file for complete search history.

(56) References Cited

U.S. PATENT DOCUMENTS

| | | | | |
|---|---|---|---|---|
| 4,307,832 A | * | 12/1981 | Taki et al. | 228/5.1 |
| 4,327,482 A | * | 5/1982 | Araki et al. | 29/740 |
| 4,440,355 A | * | 4/1984 | Mori et al. | 156/584 |
| 4,480,780 A | * | 11/1984 | Claeskens et al. | 228/180.21 |
| 4,934,891 A | * | 6/1990 | Hawkswell | 414/223.01 |
| 4,934,892 A | * | 6/1990 | Smith et al. | 414/412 |
| 5,153,983 A | * | 10/1992 | Oyama | 29/740 |
| 5,184,397 A | * | 2/1993 | Hidese | 29/740 |
| 5,628,107 A | * | 5/1997 | Nushiyama et al. | 29/740 |
| 5,649,356 A | * | 7/1997 | Gieskes | 29/833 |
| 5,852,869 A | * | 12/1998 | Gieskes et al. | 29/834 |
| 5,911,456 A | * | 6/1999 | Tsubouchi et al. | 29/833 |
| 6,036,425 A | * | 3/2000 | Seto | 414/277 |
| 6,199,272 B1 | * | 3/2001 | Seto et al. | 29/740 |
| 6,446,331 B1 | * | 9/2002 | Horigome | 29/832 |
| 2005/0005435 A1 | * | 1/2005 | Yanagida | 29/834 |

* cited by examiner

*Primary Examiner* — Derris H Banks
*Assistant Examiner* — Tai Nguyen
(74) *Attorney, Agent, or Firm* — Foley & Lardner LLP

(57) ABSTRACT

Component placement apparatus (1, 21) comprising a storage device (2) for storing components, means (5, 25, 71, 81, 91) for transporting a component from the storage device (2) to a transfer device (6, 26) comprising at least one component pickup position (11), and a component pick and place device (7) for picking up a component from the pickup position and placing the component on a desired location on a substrate (8) positioned on a substrate support. The transfer device (6, 26) is movable between a position relatively close to the stationary storage device (2) and a variable desired position above the substrate support relatively close to the movable pick and place device whilst the means (5, 25, 71, 81, 91) for transporting a component from the storing device to the transfer device (6, 26) comprise guiding means for guiding a tape (4) comprising components from reel (3) located in the storage device (2) into the component pickup position (11) on the transfer device (6, 26).

6 Claims, 4 Drawing Sheets

COMPONENT PLACEMENT APPARATUS

CROSS-REFERENCE TO RELATED PATENT APPLICATIONS

This application claims priority to European Patent Office Application No. 04103672.4, filed Jul. 30, 2004. This application is a National Stage of PCT Application No. NL2005/000416, filed Jun. 9, 2005.

BACKGROUND

The invention relates to a component placement apparatus comprising a storage device for storing components, means for transporting a component from the storage device to a transfer device comprising at least one component pickup position, and a component pick and place device for picking up a component from the pickup position and placing the component on a desired location on a substrate positioned on a substrate support.

Such a component placement device is known from U.S. Pat. No. 5,649,356. The component placement apparatus according to this U.S. patent comprises a rotatable transfer device by means of which a component from the storage device is being picked up and being presented at a pickup position. From the pickup position a component is being picked up by means of the component pick and place device and placed on a desired location on the substrate.

The storage device, the transfer device as well as the component pick and place device constitute one single unit, which is movable above the substrate support and the substrate positioned thereon.

With such a component placement device the time necessary for picking up a component by means of the component pick and place device and placing the component on the desired location on the substrate is relatively short since the pickup position can be brought relatively close to the desired location on the substrate on which the component needs to be placed. However, since the storage device, the transfer device and the component pick and place device are being moved as one single unit above the substrate, this unit is relatively bulky and the accuracy by means of which said unit can be positioned above the desired location on the substrate will be relatively poor. By moving the storage device the components will hit each other and might get damaged. Furthermore, refill of the storage device when moving is dangerous, so that refill only can take place if the whole unit comprising the storage device is brought to a standstill. This has the disadvantage that during the standstill no components can be placed on the substrate.

SUMMARY

It is an object of the invention to provide a component placement apparatus by means of which the time necessary for picking and placing a component by means of the component pick and place device is relatively small whereas the accuracy by means of which the component can be placed on a desired location on the substrate is relatively high.

This object has been achieved by the component placement apparatus according to the invention in that the transfer device is movable between a position relatively close to the stationary storage device and a variable desired position above the substrate support relatively close to the movable pick and place device whilst the means for transporting a component from the storing device to the transfer device comprise guiding means for guiding a tape comprising components from reel located in the storage device to the component pickup position on the transfer device.

Since the transfer device and the pick and place device are being moved independently of each other, the accuracy by means of which the pick and place can be positioned above the substrate is relatively high. Since the tape comprising the components is being transported from the stationary storage device to the pickup position at the transfer device which is movable to a position relatively close to the movable pick and place device, the time necessary for the pick and place device to travel between the pick up and place locations is relatively small. Another advantage of the component placement apparatus according to the invention is that the stationary storing device renders the maintenance of the storage device as well as the replenishing of the storage device by adding a new tape relatively easy.

An embodiment of the component placement apparatus according to the invention is characterized in that the transfer device comprises several component pickup positions for presenting several components from different tapes at the same time.

By providing on the transfer device several different tapes, several different components which need to be placed subsequently on the substrate by means of the pick and place device are located relatively close to the pick and place device. The overall time for placing the several components by means of the pick and place device on the substrate is hereby further reduced.

Another embodiment of the component placement apparatus according to the invention is characterized in that the guiding means comprise movable rollers located between the storage device and the transfer device.

By means of such movable rollers the tape can easily be guided from the storage device to the transfer device whereby due to the movable rollers the tape can be maintained tensioned so that a good guidance of the tape is assured independently of the position of the transfer device with respect to the storage device.

Yet a further embodiment of the component placement apparatus according to the invention is characterized in that the component placement apparatus comprises control means for controlling the length of the tape between the storage device and the transfer device.

By means of the control means the length of the tape between the storage device and the transfer device can be controlled in such a manner that sufficient length of tape is available between the storage device and the transfer device to be able to move the transfer device with respect to the storage device away from the storage device. When reducing the distance between the transfer device and the storage device the length of tape is being tensioned so that a slack tape is being avoided. Such a piece of slack tape renders the control of the tape difficult. It is also possible to windup the tape on the reel to avoid such slackening of the tape.

Another embodiment of the component placement apparatus according to the invention is characterized in that the component pickup position is located on a level above the substrate and the support on which the substrate is being positioned.

In this manner it is possible to position the component pickup position above the substrate relatively close to the location on which the component must be placed. In the space between the level on which the component is picked up and the level on which the component is placed a camera can be inserted to determine the position of the component with respect to the pick and place device.

BRIEF DESCRIPTION OF THE DRAWINGS

The invention will now further be explained with reference to the drawings in which.

DETAILED DESCRIPTION

Like parts are numbered alike in the figures.

Figure 1:
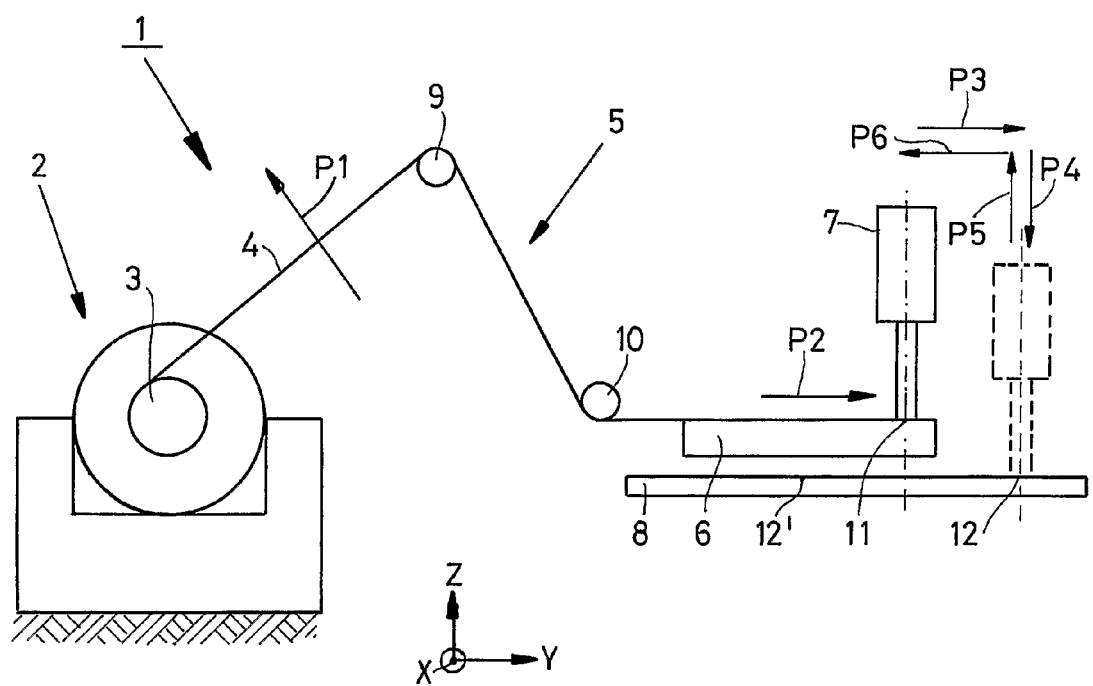
FIG. 1 is a side view of a first embodiment of a component placement apparatus according to the invention.

FIG. 1 shows a side view of a first embodiment of a component placement apparatus 1 according to the invention. The apparatus a tape 4 being wound up thereon, guiding means 5 for guiding the tape 4 from the storage device 2 to a transfer device 6, a pick and place device 7 as well as a substrate support (not shown) on which a substrate 8 is being positioned.

The storage device 2 is stationary located so that maintenance of the storage device 2 is relatively easy. Furthermore replacing of the reel 3 by another reel 3 with the same kind or another kind of components and splicing the former tape with the new tape is due to the stationary storage device 2 relatively easy. The tape 4 is guided from the storage device 3 over two rotatable rollers 9, 10 of the guiding means 5 to the transfer device 6. The roller 10 has a fixed position with respect to the transfer device 6. The roller 9 is movable in and opposite to a direction as indicated by arrow P1 under the influence of a spring force (not shown) to maintain the tape 4 between the reel 3 and the transfer device 6 tensioned. The transfer device 6 is movable together with the roller 10 in and opposite to a direction as indicated by arrow P2, extending in the Y-direction above the substrate 8 and above components already placed on said substrate 8. The tape 4 is guided over the transfer device 6 to a component pickup position 11, at which position 11 a component located in a compartment of said tape 5 can be picked up by means of the pick and place device 7. The pick and place device 7 may comprise for example a vacuum nozzle. The pick and place device 7 is movable in and opposite to the X-, Y- and Z-direction. After picking up a component from the pickup position 11, the pick and place device 7 is moved in the Z-direction, then in the Y-direction as indicated by arrow P3, then in the negative Z-direction as indicated by arrow P4 to place the component on the desired location 12 on the substrate 8. After placing the component the pick and place device 7 is being moved in the Z-direction as indicated by arrow P5 and then in the negative Y-direction as indicated by arrow P6 to position the pick and place device 7 above the component pickup position 11 so that new component can be picked up.

If another component needs to be placed for example on a position 12', the transfer device 6 as well as the pick and place device 7 are being moved in the negative Y-direction to a position whereby the component can easily be picked up from the transfer device 6 by means of the pick and place device 7 so that the time necessary for picking up a component and placing the component on the desired location 12' is as short as possible.

When moving the transfer device 6 as well as the roller 10 in the negative Y-direction, the roller 9 is moved in the direction as indicated by arrow P1 to maintain the length of tape between the reel 3 and the component pickup position 11 tensioned.

After picking up a component from the pickup position 11, the pick and place devices 7 may also be moved in or opposite to the X-direction so that components can be placed on the whole substrate 8.

Figure 2:
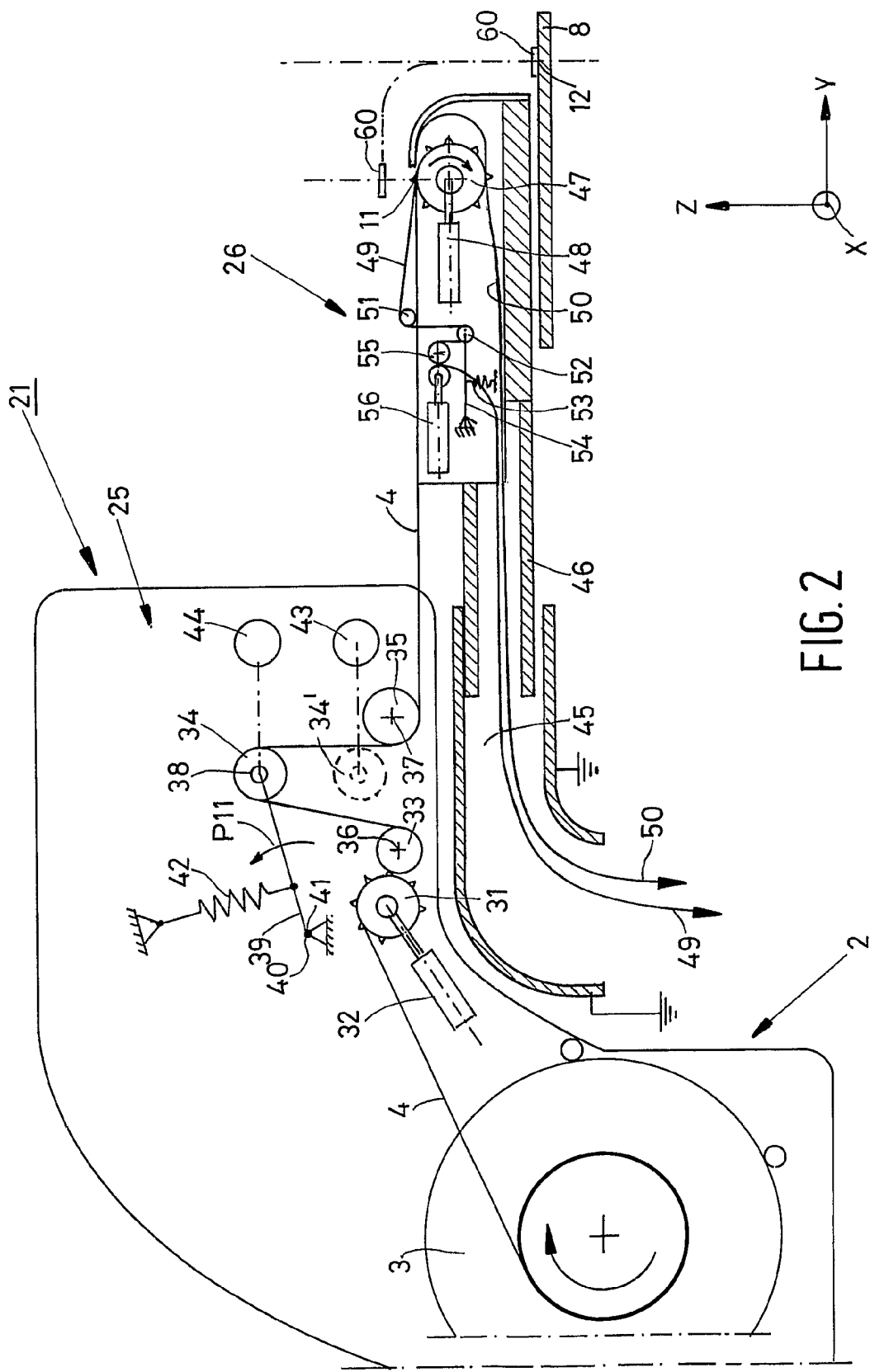
FIG. 2 is a side view of a second embodiment of a component placement apparatus according to the invention.

FIG. 2 shows a side view of a second embodiment of a component placement apparatus 21 according to the invention whereby the guiding means 25 as well as the transfer device 26 are further detailed.

The guiding means 25 comprise a sprocket wheel 31 driven by a motor 32, by means of which sprocket wheel 31 a tape 4 will be pulled from the reel 3. The guiding means 25 furthermore comprises rotatable rollers 33, 34, 35. The rollers 33, 35 are rotatable around axes 36, 37 whilst the roller 34 is rotatable around an axis 38, which is connected to a lever 39. The lever 39 is swivable with an end 40 removed of the axis 38 round a swivel point 41 under the influence of a spring force 42 in and opposite to a direction as indicated by arrow P11. The roller 34 is movable between the position as shown in full lines in FIG. 2 to a position indicated as roller 34' shown in dashed lines. The guiding means 25 furthermore comprises sensor 43, 44 by means of which the lowest position of the roller 34' as well as the highest position of the roller 34 can be detected.

The component placement apparatus 21 according to the invention comprises a stationary sleeve 45 in which a sleeve 46 connected to the transfer device 26 is slidably located.

The transfer device 26 comprises a sprocket wheel 47 driven by a motor 48 for pulling the tape 4 from the guiding means 25 to the transfer device 26. Tapes comprising components are well known in the prior art and usually consist of two tape parts, one tape part with compartments in which components are being located and one tape part covering the compartments. Near the sprocket wheel 47 the cover tape 49 is being separated from the compartment tape 50 to expose a component in the compartment tape 50 at the component pickup position 11. The cover tape 49 is being guided over a fixed mounted roller 51, a roller 52 which is swivable under spring force 53 by means of a lever 54 and a sprocket wheel 55 driven by a motor 56. The position of the movable roller 52 is detectable by means of sensors (not shown) in the same manner as detecting the position of the roller 34 by means of the sensors 43, 44.

The cover tape 49 is being transported through the sleeve 46 as well as the sleeve 45 to a waste container (not shown). The compartment tape 50 is being transported solely by the sprocket wheel 47 and directed through the sleeve 46 as well as the sleeve 45 to another of the same waste container (not shown).

The cover tape 49 as well as the compartment tape 50 may be cut into small pieces, if desired, before entering the waste container(s). Said cutting can be done just before entering the waste container(s) or in the transfer device 26.

The component 60 which is presented at the pickup position 11 is being picked up by means of a pick and place device and is subsequently being placed on the desired location 12 on the substrate 8.

The motors 32, 48 and 56 are being controlled by means of control means.

If a new compartment with a new component needs to be presented at the pickup position 11, the motor 48 is being energized to index the sprocket wheel 47. If by means of the sensors it is being informed to the control means that the roller 52 is in its highest position, the motor 56 is de-energized so that the sprocket wheel 55 is being stopped. As soon as the roller 52 is in its lowest position the motor 56 is being energized again so that cover tape 49 is being transported in the direction of the waste container.

If by means of the sensor 43 it is detected that the roller rotate the sprocket wheel 31 so that additional tape 4 is being introduced in the guiding means 25. Thereby the roller 34 will be moved upwards under the influence of the spring 42 until the highest position is being detected by the sensor 34 in case of which the motor 32 will be stopped by means of the control means so that no additional tape will be introduced between the rollers 33, 35.

By the embodiments as shown in FIGS. 1 and 2 the transfer device 6, 26 is movable in and opposite to the Y-direction to be able to be positioned relatively close to the desired location 12 on the substrate 8 so that the time necessary for the pick and place device 7 for picking up a component from the component pickup position 11 and to place the component on the desired location 12 on the substrate 8 is relatively short. As already indicated above it is possible to move the pick and place device in and opposite to the Y-direction as well as in and opposite to the X-direction. It is also possible to move the transfer device 6, 26 not only in and opposite to the Y-direction but also in and opposite to the X-direction. In such case additional rollers need to be added to be able to guide and control the length of the tape also in the X-direction.

Figure 3:
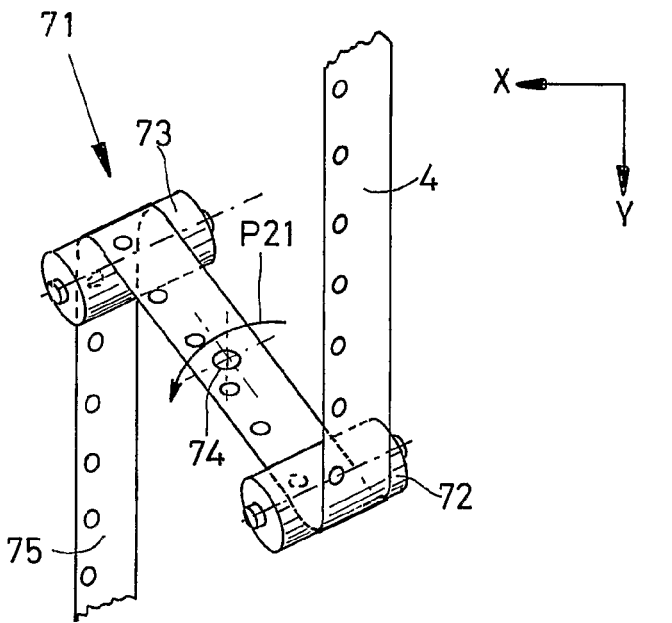
FIG. 3 shows a top view of a part of a third embodiment of a component placement apparatus according to the invention.
Figure 4:
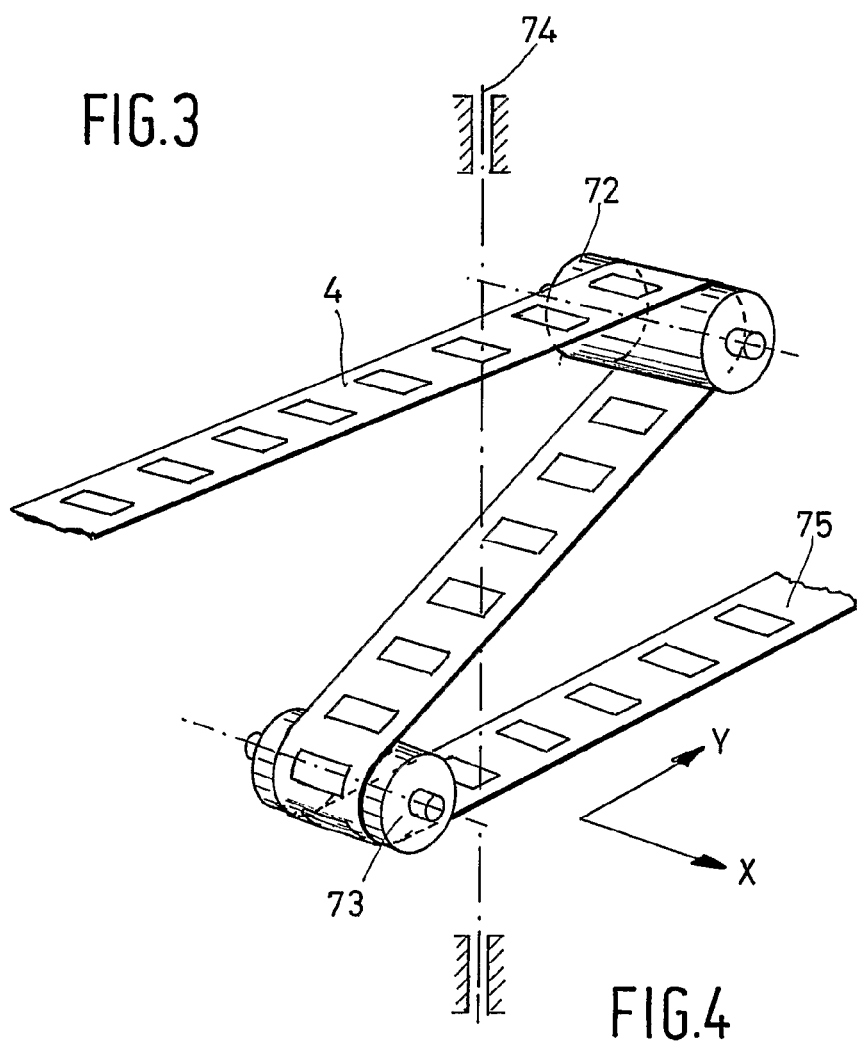
FIG. 4 is a perspective view of the part as shown in FIG. 3.

FIG. 3 and 4 show a top view and a perspective view of a part of a third embodiment of a component placement device according to the invention 71, whereby the means for transporting a component from the storing device to a transfer device comprise two rotatable rollers 72, 73 which rollers 72, 73 are as one single unit swivable around a vertical axis 74. By swiveling the rollers 72, 73 around the swivel axis 74 in or opposite to the direction as indicated by arrow P21 the tape 4 cannot only be transported in the Y-direction but the tape part 75 extending to the transfer device, is also movable in or opposite to the X-direction.

Figure 5:
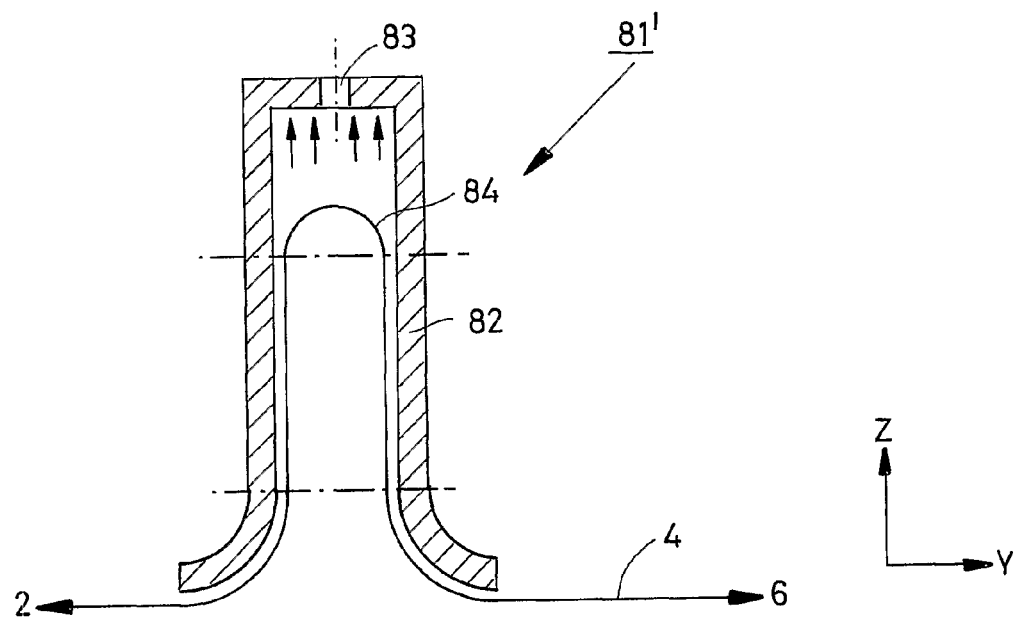
FIG. 5 is a side view of a part of a fourth embodiment of a component placement apparatus according to the invention.

FIG. 5 shows another embodiment of a means for transporting a component from the storing device to the transfer device, whereby said means 81 comprise a tube 82 which is open in the direction towards the tape 4 and has a small opening 83 on a side remote of the tape 4. Connected to said opening 83 is a vacuum source. A loop 84 of the tape 4 extending from the storage device 2 to the transfer device 6 is located in the tube 82. The loop 84 is maintained by means of the vacuum source. If a force is applied on the tape 4 by means of the transfer device 6 in the Y-direction the loop 84 will get smaller, whilst the loop 84 will get larger when additional tape 4 is being added from the storage device 2.

Figure 6:
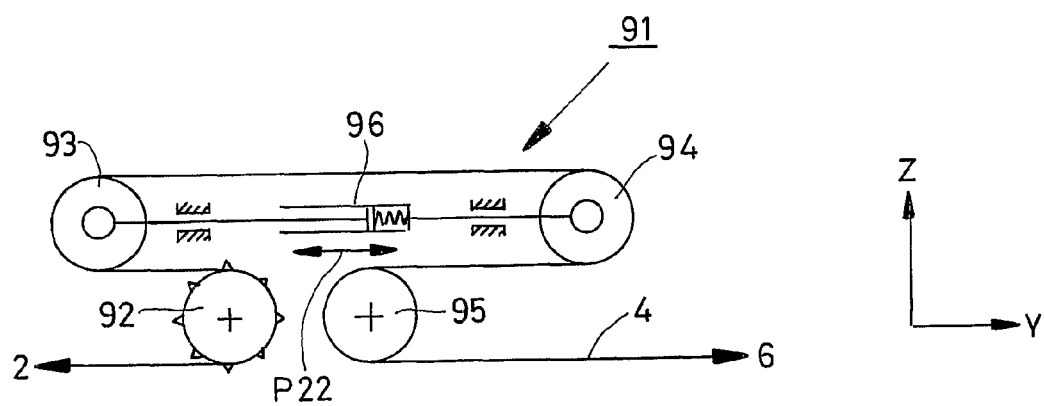
FIG. 6 is a side view of a part of a fifth embodiment of a component placement apparatus according to the invention.

FIG. 6 shows a means 91 for transport the tape 4 from the storage device 2 to the transfer device 6, comprising a sprocket wheel 92 and three rollers 93, 94, 95. The sprocket wheel 92 as well as the roller 95 are rotatable around fixed axis whilst the rollers 93, 94 are rotatable around axis which can be moved towards each other and away from each other in the direction as indicated by the double arrow P22 under the influence of a spring 96. If more tape 4 is needed at the transfer device 6 the rollers 93, 94 will move towards each other whilst the rollers 93, 94 will be moved away from each other if additional tape 4 is added from the storage device 2.

It is emphasized that several reels 3 are located next to each other whereby the tapes from the reels 3 are guided to a number of pickup positions 11 on the transfer device 6, 26.

It is possible to transport the cover tape 49 by other means to the waste container, for example solely by means of guiding rollers, by means of suction, etc.

It is also possible to tension the tape 4 by other means.

The invention claimed is:

1. Component placement apparatus, comprising:
a stationary storage device for storing components;
a transporting mechanism configured to transport components on a tape to a component pickup position corresponding to the tape, wherein the transporting mechanism comprises a guiding mechanism to guide the tape from a reel located in the storage device to the component pickup position corresponding to the tape;
a transfer device defining the component pickup position corresponding to the tape, the transfer device being movable toward and away from the stationary storage device to move the component pickup position corresponding to the tape to a variable desired position above a substrate support; and
a movable component pick and place device configured to pick up a component disposed at the component pickup position and to place the component on a desired location on a substrate positioned on the substrate support.

2. Component placement apparatus according to claim 1, wherein the transfer device comprises several component pickup positions for presenting several components from different tapes at the same time.

3. Component placement apparatus according to claim 1, wherein the guiding mechanism comprises movable rollers located between the storage device and the transfer device.

4. Component placement apparatus according to claim 1, wherein the component placement apparatus comprises a control mechanism to control the length of the tape between the storage device and the transfer device.

5. Component placement apparatus according to claim 1, wherein the component pickup position is located on a level above the substrate and the support on which the substrate is positioned.

6. The component placement apparatus according to claim 1, wherein the component placement apparatus is configured such that when transfer device moves toward or away from the stationary storage device at least a portion of the tape moves with the transfer device.

* * * * *